United States Patent [19]
Brehmer et al.

[11] Patent Number: 4,717,838
[45] Date of Patent: Jan. 5, 1988

[54] HIGH INPUT IMPEDANCE, HIGH GAIN CMOS STROBED COMPARATOR

[75] Inventors: Kevin E. Brehmer, San Jose; Wieser James B., Union City, both of Calif.

[73] Assignee: National Semiconductor Corporation, Santa Clara, Calif.

[21] Appl. No.: 931,339

[22] Filed: Nov. 14, 1986

[51] Int. Cl.⁴ .................. H03K 5/24; H03K 3/356
[52] U.S. Cl. .................... 307/355; 307/362; 307/279; 307/530
[58] Field of Search ............ 307/362, 355, 279, 530

[56] References Cited

U.S. PATENT DOCUMENTS

| | | | |
|---|---|---|---|
| 4,150,311 | 4/1979 | Matsuda et al. | 307/279 |
| 4,511,810 | 4/1985 | Yukawa | 307/362 |
| 4,561,702 | 12/1985 | McAdams | 307/362 |
| 4,572,974 | 2/1986 | Frieling et al. | 307/362 |
| 4,602,167 | 7/1986 | Yukawa | 307/279 |

OTHER PUBLICATIONS

H. L. Fiedler and B. Hoefflinger, "A CMOS Pulse Density Modulator for High-Resolution A/D Converters", IEEE Journal, vol. 19, No. 6, Dec., 1984.

Primary Examiner—John Zazworsky
Attorney, Agent, or Firm—Limbach, Limbach & Sutton

[57] ABSTRACT

A CMOS high gain strobed comparator comprising a cascoded input differential stage with current mirror loads. The DC biasing for the input stage cascode devices is set by a replica biasing technique. The loads to the input differential stage are simple current mirrors which drive a set of cross-coupled devices that form a latch. The high gain of the comparator is realized in the second stage. The differential output of the comparator drives a second latch. This second cross-coupled latch stores and maintains the comparator data even after the strobe signal destroys the data of the differential output.

7 Claims, 1 Drawing Figure

HIGH INPUT IMPEDANCE, HIGH GAIN CMOS STROBED COMPARATOR

BACKGROUND OF THE INVENTION

1. Field of the Invention

The present invention relates to semiconductor integrated circuits and, in particular, to an improved CMOS comparator design.

2. Discussion of the Prior Art

Typical problems associated with any comparator design are speed, input referred offset voltage and noise, and power supply rejection.

A CMOS comparator which is representative of the prior art is disclosed by H. L. Fiedler and B. Hoefflinger, "A CMOS Pulse Density Modulator for High Resolution A/D Converters", 1984 IEEE.

The Fiedler/Hoefflinger circuit includes no input cascode devices, utilizes a double turn-around prior to the output, and provides no current mirrors before the latch stage. These characteristics contribute to power supply coupling and Miller feedback to the high impedance input. Both of these effects can add undesirable charge onto the high impedance capacitor which is holding the desired input signal.

SUMMARY OF THE INVENTION

The present invention addresses the above-described problems of capacitive coupling and power supply rejection to the comparator input and also provides a comparator having increased speed.

The CMOS high gain strobed comparator of the present invention is applicable to, but not limited to, high input impedance sources.

The comparator of the present invention comprises a cascoded input differential stage with current mirror loads. The DC biasing for the input stage cascode devices is set by a replica biasing technique. The loads to the input differential stage are simple current mirrors which drive a set of cross-coupled devices that form a latch. The high gain of the comparator is realized in the second stage. The differential output of the comparator drives a second latch. This second cross-coupled latch stores and maintains the comparator data even after the strobe signal destroys the data at the differential input.

DETAILED DESCRIPTION OF A PREFERRED EMBODIMENT

Figure 1:
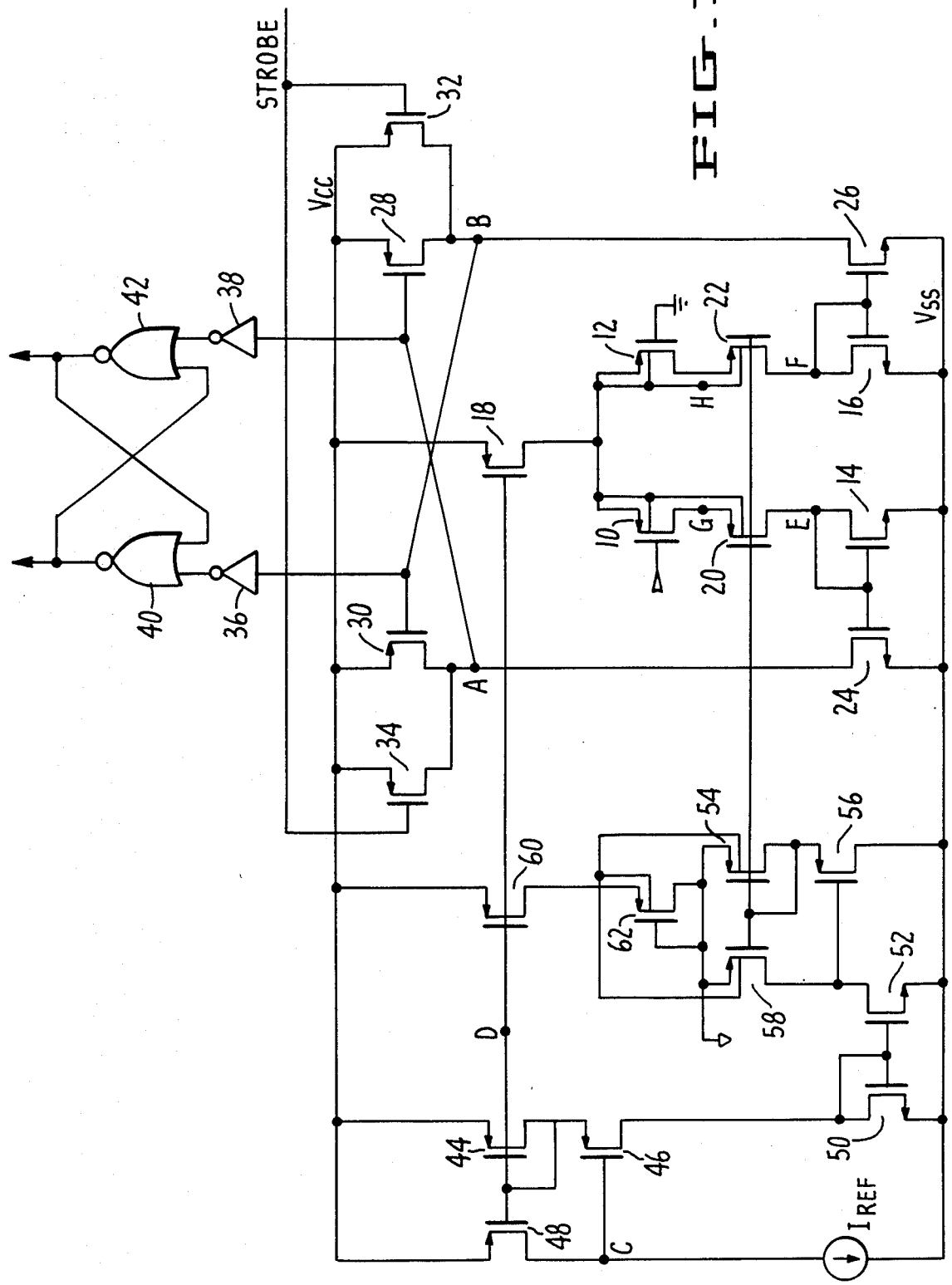
FIG. 1 is a circuit diagram illustrating a comparator design in accordance with the present invention.

FIG. 1 shows a high input impedance CMOS strobed comparator in accordance with the present invention.

The comparator of the present invention is illustrated in FIG. 1 as part of an A/D converter in which the input signal is stored on a capacitor and applied to the comparator. This comparator design is not limited to high impedance input sources or A/D converter applications, but has special application in this sensitive design.

The comparator can be implemented in any of the CMOS processes, including standard or inverted CMOS, metal gate CMOS, and single or double poly gate CMOS.

The input stage of the comparator is a differential amplifier stage which includes transistors 10, 12, 20, 22, 14, 16 and 18. Transistors 10 and 12, together with corresponding cascode devices 20 and 22, form an input differential pair. Transistors 14 and 16 represent the loads for the differential amplifier stage and form half of a current mirror connection which drives the second stage. Transistor 18 provides current to the differential amplifier stage.

Current mirrors consisting of transistors 14 and 24, and transistors 16 and 26, translate a delta in current which is produced by the input differential stage as a result of a difference in voltage at the gates of transistors 10 and 12. This current delta is applied to a high input impedance cross-coupled latch consisting of transistors 28 and 30. The cross-coupled latch utilizes positive feedback to enhance the voltage differential at nodes A and B that occurs as a result of the initial current delta. Most of the comparator gain comes from this second stage latch. Once tripped, the outputs of the latch, i.e., nodes A and B, remain at the supplies until the clamp devices, described below, remove the positive feedback from the latch.

Transistors 32 and 34 are clamp devices that remove the positive feedback from the latch and set up the comparator for a future comparison. The positive feedback is removed when a logic low level is applied to the gates of transistors 32 and 34, thus turning on these devices and forcing nodes A and B to $V_{cc}$. The comparator remains in the clamped state until the input to the next comparison has settled. Then the clamps are removed and the comparator latches the result of the new input comparison.

Once the comparator enters the clamped state, the data stored in the comparator latch is destroyed. Therefore, a secondary latch is needed to store the comparator results after the comparator is placed in the clamped stage. This secondary latch is comprised of inverters 36 and 38 and cross-coupled NOR gates 40 and 42.

The bias generator for the comparator requires a current source to be connected from node C to $V_{ss}$. Transistors 44, 46 and 48 form an MOS Wilson current mirror which sets up a bias voltage at node D for further current biasing and reflects $I_{REF}$ into diode connected transistor 50. Transistors 50 and 52 form a simple current mirror which reflects $I_{REF}$ in transistors 54 and 58 and equals the current provided by transistor 60. If there is any mismatch in current between the current that transistor 60 can deliver and the current that the second Wilson current source can sink, it will appear as a ground current at the sources of transistors 54 and 58.

A replica biasing technique is used to bias the input cascode devices precisely. Transistors 54, 62 and 60 replicate the current densities of transistors 20, 10 and 18, respectively, of the comparator input stage and set the bias conditions for the comparator input stage devices. Transistor 62 will set up a bias condition on transistor 10 such that it appears to be diode connected, assuming the gate of device 10 is grounded. This is accomplished by connecting transistor 62 in a diode configuration, i.e., gate connected to drain, with the gate-drain connection grounded, and by keeping the current densities of transistors 54 and 20 the same. The diode connection of transistor 54 sets the bias voltage for the cascode devices 20 and 22 to be slightly greater than a threshold below ground. The substrates of devices 54 and 58 are connected common to device 62 to exactly mimic the comparator devices 20 and 22 substrate connections.

Thus, in accordance with the present invention, the cascode devices 20 and 22 in the input stage are used to improve the power supply rejection from $V_{ss}$ and to reduce the Miller feedback effects at the high impedance capacitive input to the comparator. Nodes E and F of the comparator input stage follow any variations of the negative supply $V_{ss}$. Without the input cascode devices 20 and 22, the supply variations that appear at node E would capacitively couple to the input via the gate-to-drain capacitance $C_{gdl}$ of device 10. This undesirable supply coupling onto the input could be large enough to change the value of the desired input signal and cause errors in the comparator output data. By adding the input cascode devices 20 and 22, any direct power supply variations at nodes E and F are greatly attenuated at nodes G and H and are further attenuated at the input.

The Miller Feedback Effect is also greatly attenuated when the input cascode devices 20 and 22 are included in the input stage. The cascode devices 20 and 22 provide a low impedance source to the drain of device 10, thereby attenuating the gain from the input to the drain of device 10. Without the cascode devices 20 and 22, the gain to the drain of device 10 would be much greater and, therefore, the amount of coupling back to input via $C_{gdl}$ would be greater, which would effectively reduce the comparator gain with high impedance sources.

Speed is improved by using a single current gain stage which drives a high impedance cross-coupled latch. The diodes in the input stage prevent the drain-to-source voltage across cascode devices 20 and 22 from collapsing, and prevent the gates of devices 24 and 26 from collapsing to the negative supply $V_{ss}$ when a large input signal is applied.

The prevention of device collapsing speeds up the comparator recovery time after a large input signal has been applied. Clamping the latch outputs to $V_{cc}$ speeds up the set-up time of the comparator before the next comparison.

The above description has focused on a comparator design using an N− well CMOS process. The same design can be implemented in a P− well process by simply reversing the types of each of the devices.

Furthermore, it should be understood that various alternatives to the embodiment described herein may be employed in practicing the present invention. It is intended that the following claims define the invention and that the structure within the scope of these claims and their equivalents be covered thereby.

We claim:

1. A high gain strobed comparator comprising:
an input stage which receives a first input signal and a second input signal and generates a differential output signal having a current value which is related to the voltage difference between the input signal and the output signal;
current mirror means which receives the differential ouput current and generates a corresponding current signal;
a first latch which receives the current signal from the current mirror means at first and second latch inputs and which includes means for providing a positive feedback signal to the first and second latch inputs such that the first latch provides a differential output voltage which is enhanced over the voltage differential at the first and second latch inputs;
means for storing the differential output voltage received from the first latch; and
clamping means coupled to the first latch and responsive to a strobe signal for removing the positive feedback signal from the first latch such that the differential output voltage is removed from the first latch to enable the first latch to receive a subsequent current signal from the current mirror means.

2. A comparator as in claim 1 wherein the input stage comprises:
a first pair of cascoded transistors connected to receive the first input signal;
a second pair of cascoded transistors connected to receive the second input signal;
an input transistor connected between a positive supply voltage and both the first pair and the second pair of cascoded transistors for providing current pair thereto;
a first load transistor connected between an output of the first pair of cascoded transistors and a negative supply voltage; and
a second load transistor connected between an output of the second pair of cascoded transistors and the negative supply voltage.

3. A comparator as in claim 2 wherein the current mirror means comprises:
a first current mirror which includes the first load transistor and a first current mirror transistor, the first load transistor and the first current mirror transistor having a common gate which is connected to receive the output of the first pair of cascoded transistors, the output of the first current mirror being connected to the first input of the first latch; and
a second current mirror which includes the second load transistor and a second current mirror transistor, the second load transistor and the second current mirror transistor having a common gate which is connected to receive the output of the second pair of cascoded transistors, the output of the second current mirror being connected to the second input of the first latch.

4. A comparator as in claim 3 wherein the first latch comprises:
a first field effect transistor (FET) of the type which includes a source, a drain and a gate and having its source connected to the positive supply voltage, its drain connected to the output of the first current mirror and its gate commonly connected to the output of the second current mirror and to a first input of the storing means; and
a second FET having its source connected to the positive supply voltage, its drain connected to the output of the second current mirror and its gate commonly connected to the output of the first current mirror and to a second input of the storing means.

5. A comparator as in claim 4 wherein the clamping means comprises:
a first clamping FET having its drain connected to the drain of the first FET, its source connected to the positive supply voltage and its gate connected to receive the strobing signal; and
a second clamping FET having its drain connected to the drain of the second FET, its source connected to the positive supply voltage and its gate connected to receive the strobing signal.

6. A comparator as in claim 5 wherein the storing means comprises:
   a first invertor having its input connected to the first input of the latch;
   a first NOR gate which receives a first input from the ouput of the first invertor and a second input from the output of a second NOR gate;
   a second invertor having its input connected to the second input of the first latch; and
   a second NOR gate which receives a first input from the output of the second invertor and a second input from the output of the first NOR gate.

7. A comparator as in claim 6 and further including replica biasing means connected to the first and second pairs of cascoded transistors and to the input transistor for replicating the current densities thereof.

* * * * *

UNITED STATES PATENT AND TRADEMARK OFFICE
CERTIFICATE OF CORRECTION

PATENT NO. : 4,717,838
DATED : January 5, 1988
INVENTOR(S) : Kevin E. Brehmer and James B. Wieser It is certified that error appears in the above-identified patent and that said Letters Patent are hereby corrected as shown below:

On the cover page under "[75] Inventors:" change

"Wieser James B." to --James B. Wieser--.

Signed and Sealed this

Fourth Day of October, 1988

Attest:

DONALD J. QUIGG

*Attesting Officer*  *Commissioner of Patents and Trademarks*